(12) United States Patent
Andersen et al.

(10) Patent No.: US 12,463,045 B2
(45) Date of Patent: Nov. 4, 2025

(54) SELECTIVE TRENCH MODIFICATION USING DIRECTIONAL ETCH

(71) Applicant: Applied Materials, Inc., Santa Clara, CA (US)

(72) Inventors: Tassie Andersen, Salem, MA (US); Shurong Liang, Lynnfield, MA (US)

(73) Assignee: Applied Materials, Inc.

( * ) Notice: Subject to any disclaimer, the term of this patent is extended or adjusted under 35 U.S.C. 154(b) by 501 days.

(21) Appl. No.: 17/969,333

(22) Filed: Oct. 19, 2022

(65) Prior Publication Data
US 2024/0136194 A1 Apr. 25, 2024
US 2024/0234156 A9 Jul. 11, 2024

(51) Int. Cl.
*H01L 21/3065* (2006.01)

(52) U.S. Cl.
CPC ............................... *H01L 21/3065* (2013.01)

(58) Field of Classification Search
None
See application file for complete search history.

(56) References Cited

U.S. PATENT DOCUMENTS

| | | | |
|---|---|---|---|
| 8,669,612 B2* | 3/2014 | Blanchard | H10D 30/66 438/270 |
| 9,287,123 B2 | 3/2016 | Srinivasan et al. | |
| 10,381,232 B2 | 8/2019 | Ruffell et al. | |
| 10,971,368 B2 | 4/2021 | Sherman et al. | |
| 11,043,380 B2* | 6/2021 | Ruffell | H01L 21/76816 |
| 2021/0375626 A1 | 12/2021 | Anglin et al. | |

* cited by examiner

*Primary Examiner* — Stephanie P Duclair
(74) *Attorney, Agent, or Firm* — KDW Firm PLLC

(57) ABSTRACT

Disclosed herein are approaches for device modification, namely, trench elongation. In one approach, a method may include providing a substrate including a plurality of surface features defining a plurality of trenches, wherein a first trench has a first trench length extending in a first direction, wherein a second trench connected to the first trench has a second trench length extending in a second direction, and wherein the first direction and the second direction are non-parallel. The method may further include delivering ions into the substrate in a reactive ion etching process, wherein the ions are delivered at a non-zero angle relative to a perpendicular extending from the substrate, and wherein the reactive ion etching process increases the first trench length of the first trench without increasing the second trench length of the second trench.

19 Claims, 5 Drawing Sheets

SELECTIVE TRENCH MODIFICATION USING DIRECTIONAL ETCH

FIELD OF THE DISCLOSURE

The present disclosure relates to semiconductor structures and, more particularly, to selective trench elongation using an angled etch.

BACKGROUND OF THE DISCLOSURE

As semiconductor devices continue to scale to smaller dimensions, the ability to pattern features becomes increasingly difficult. These difficulties include in one aspect the ability to obtain features at a target size for a given technology generation. Another difficulty is the ability to obtain the correct shape of a patterned feature, as well as the correct placement of a patterned feature. For example, given a fixed ion beam angle, there is a critical aspect ratio above which the ion beam is blocked from reaching the bottom of the trench. At this point lateral etch sharply drops.

With respect to these and other considerations the present improvements may be useful.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a substrate including a plurality of trenches, wherein a first trench of the plurality of trenches has a first trench length extending in a first direction, wherein a second trench of the plurality of trenches has a second trench length extending in a second direction, and wherein the first direction and the second direction are non-parallel. The method may further include delivering ions into the substrate in a reactive ion etching process, wherein the ions are delivered at a non-zero angle relative to a perpendicular extending from the substrate, and wherein the reactive ion etching process increases the first trench length of the first trench without increasing the second trench length of the second trench.

In another aspect, a method may include providing a substrate including a plurality of trenches, wherein a first trench of the plurality of trenches has a first trench length extending in a first direction, wherein a second trench of the plurality of trenches, connected to the first trench, has a second trench length extending in a second direction, and wherein the first direction and the second direction are non-parallel. The method may further include etching an end wall of the first trench to increase the first trench length of the first trench by delivering reactive ions into the substrate at a non-zero angle relative to a perpendicular extending from the substrate, wherein the length of the first trench is increased without increasing the second trench length of the second trench.

In yet another aspect, a trench elongation method may include providing a substrate including a plurality of surface features defining a plurality of trenches, wherein a first trench has a first trench length extending in a first direction, wherein a second trench connected to the first trench has a second trench length extending in a second direction, and wherein the first direction and the second direction are perpendicular to one another. The trench elongation method may further include etching an end wall of the first trench to increase the first trench length of the first trench by delivering ions into the substrate at a non-zero angle relative to a perpendicular extending from the substrate, wherein the first trench length of the first trench is increased without increasing the second trench length of the second trench.

BRIEF DESCRIPTION OF THE DRAWINGS

The accompanying drawings illustrate exemplary approaches of the disclosure, including the practical application of the principles thereof, as follows.

Figure 1A:
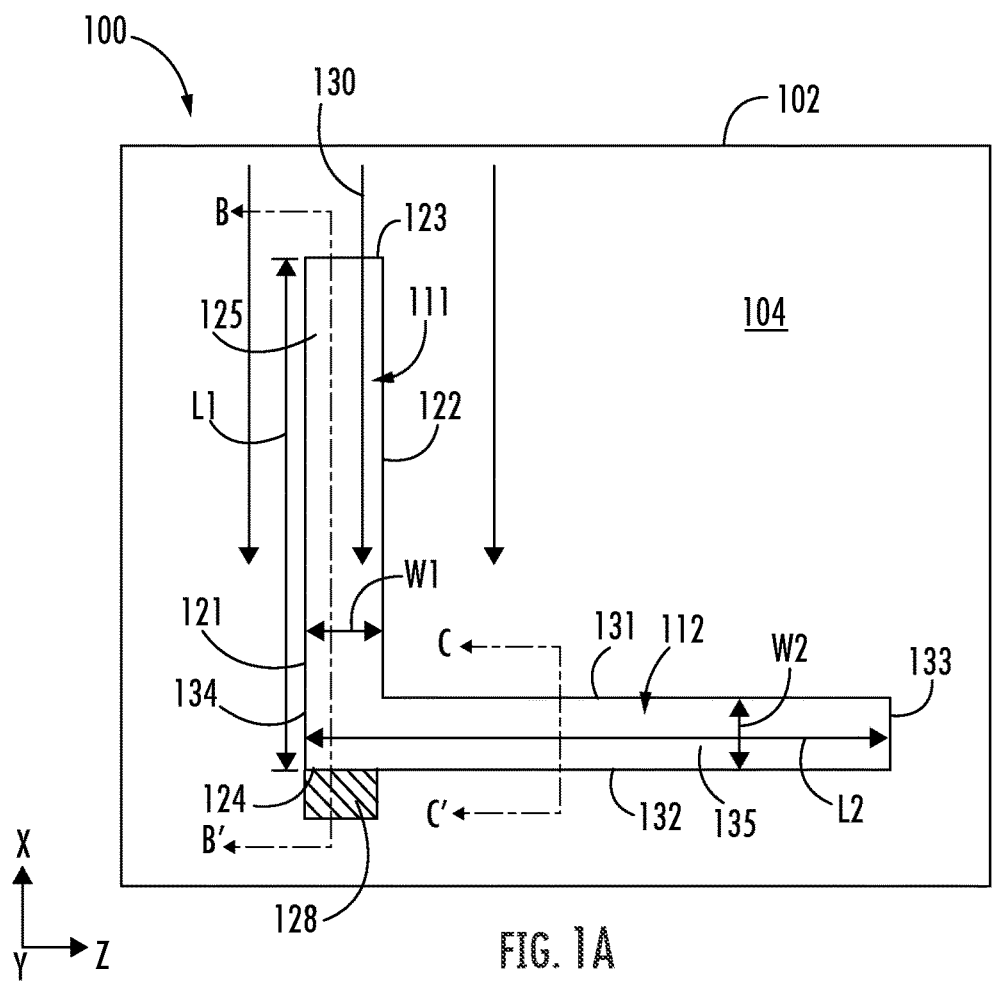
FIG. 1A is a top view of a substrate of a semiconductor device, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where various embodiments are shown. The methods may be embodied in many different forms and are not to be construed as being limited to the embodiments set forth herein. Instead, these embodiments are provided so the disclosure will be thorough and complete, and will fully convey the scope of the methods to those skilled in the art.

To address the deficiencies of the prior art described above, embodiments of the present disclosure advantageously provide ion beam shadowing to selective etch certain features in an array of structures, such as trenches. More specifically, embodiments herein provide a solution for etching 2-D and 3-D structures so as to avoid specific structures while elongating and/or thinning other structures in a complex feature array or arrangement. The aspect ratio of the array structures can be used to selectively etch only some of the areas or structures in the first direction, which may advantageously eliminate one or more masking and etch/EUV steps. As such, features (e.g., trenches) can be elongated in one direction without being elongated in a second, perpendicular direction.

Figure 1B:
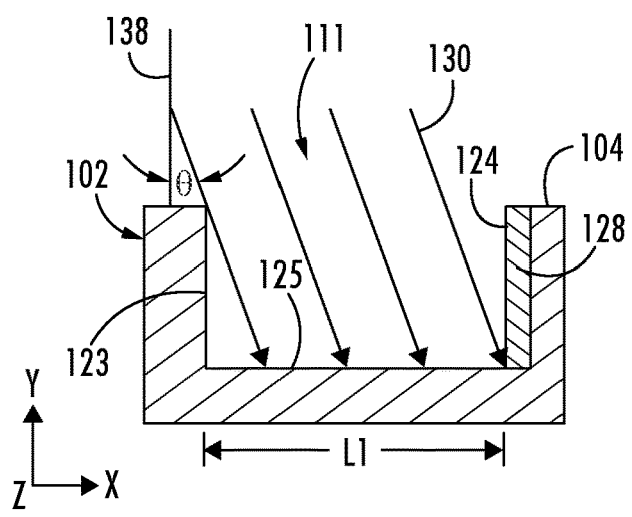
FIG. 1B is a cross-sectional view of a trench along cutline B-B' of FIG. 1A, according to embodiments of the present disclosure.
Figure 1C:
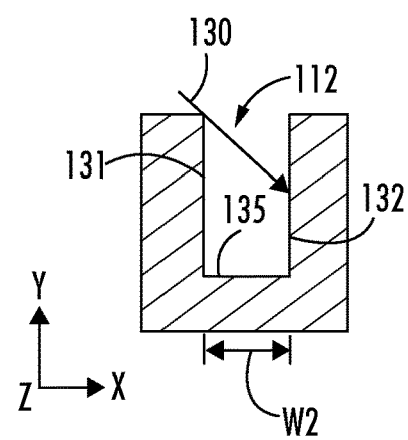
FIG. 1C is a cross-sectional view of a trench along cutline C-C' of FIG. 1A, according to embodiments of the present disclosure.

FIGS. 1A-1C depict a portion of a semiconductor device (hereinafter "device") 100, such as a substrate 102, according to one or more embodiments. As shown, the substrate 102 may include a plurality of trenches formed therein, such as a first trench 111 and a second trench 112. The first trench 111 and the second trench 112 may be recessed below a plane (e.g., x-z plane) defined by an upper surface 104 of the substrate 102. In the non-limiting embodiment shown, the first trench 111 may extend along a first direction (e.g., x-direction), while the second trench 112 may extend along a second direction (e.g., z-direction). The first and second trenches 111, 112 may join or intersect one another, as shown, or may be separated by a portion of the substrate 102. The first trench 111 may have a first length 'L1' and a first width 'W1', and the second trench 112 may have a second length 'L2' and a second width 'W2.' In the embodiment shown, L1 is greater than W1 and L2 is greater than W2. Embodiments herein are not limited in this context, however.

The first trench 111 may be defined by a first sidewall 121 opposite a second sidewall 122, a first end wall 123 opposite a second end wall 124, and a first trench bottom surface 125. Similarly, the second trench 112 may be defined by a first sidewall 131 opposite a second sidewall 132, a first end wall 133 opposite a second end wall 134, and a second trench bottom surface 135.

During processing of the substrate 102, ions 130 may be directed towards the first trench 111 and the second trench 112 at a non-zero angle θ (FIG. 1B) relative to a perpendicular 138 extending from the upper surface 104 of the substrate 102. The ions 130 may be delivered to the substrate 102 as part of a directional reactive ion etch (RIE) process for forming the first trench 111 and/or the second trench 112, or may be delivered to the substrate 102 during a subsequent RIE process for modifying certain portions of the device 100 (e.g., trench sidewalls). It will be appreciated that the angled ions 130 may be delivered to the substrate 102 using multiple exposures at different angles of incidence and direction. Although non-limiting, the ions 130 of the etch process may include F, Cl, Br, and others.

In the embodiment shown, the ions 130 etch the second end wall 124 of the first trench 111 to increase the first length L1 of the first trench 111 by removing a portion 128 of the second end wall 124. This is possible due to both the non-zero angle θ of the ions 130, which may be between 15-65°, and the aspect ratio of the first trench 111. As shown, the angled RIE generally impacts the first trench bottom surface 125 and an entire height of the second end wall 124 of the first trench 111. However, due to the aspect ratio of the second trench 112, which is different than the aspect ratio of the first trench 111, the angled RIE does not impact the second trench bottom surface 135 and does not impact an entire height of the second sidewall 132. Instead, the ions 130 are shadowed by the first sidewall 131 of the second trench 112, and may impact just an upper portion of the second sidewall 132. As a result, the dimensions of the second trench 112, such as the second length L2 and the second width W2, generally do not change as a result of the angled ions 130 etching the first trench 111.

FIGS. 2A-2E demonstrate a substrate 202, which includes a plurality of trenches 205 formed therein, processed (e.g., etched) using ions 230 delivered over a range of different angles. As will be described, regions A-L of the various trenches 205 will generally elongate differently based on an angle of the ions 230. For example, in FIG. 2A, the ions 230 may be delivered to the substrate 202 at approximately 15° relative to a perpendicular extending in the y-direction from an upper surface 204 of the substrate 202. Regions A, B, E, I, J, K, and L of the trenches 205 become elongated (e.g., along the x-direction) as a result of the ion etch. However, regions C, D, F, G, and H are generally unaffected by the ions 230. Said differently, no substantial dimensional changes are witnessed in regions C, D, F, G, and H in any of the x-y-x directions due to the aspect ratio of the trenches and the angle of the ions 230.

Figure 2A:
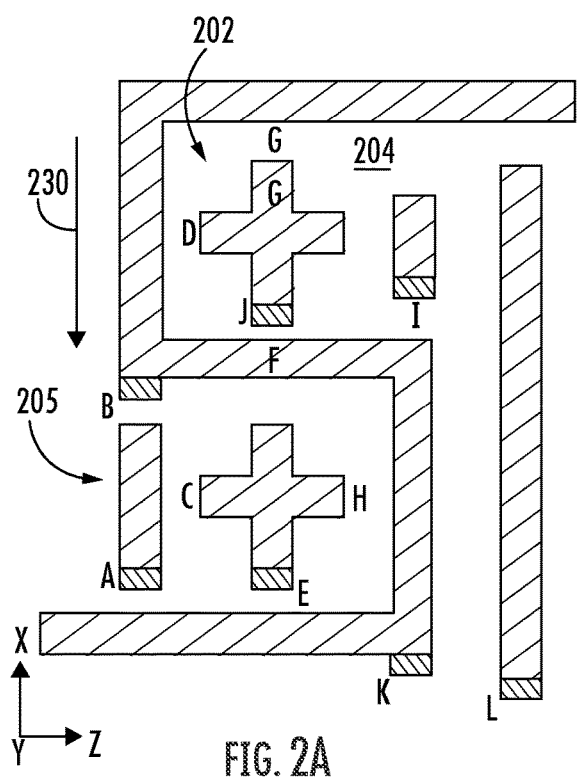
FIGS. 2A-2E are top views demonstrating processing of a substrate including trenches, according to embodiments of the present disclosure.
Figure 2B:
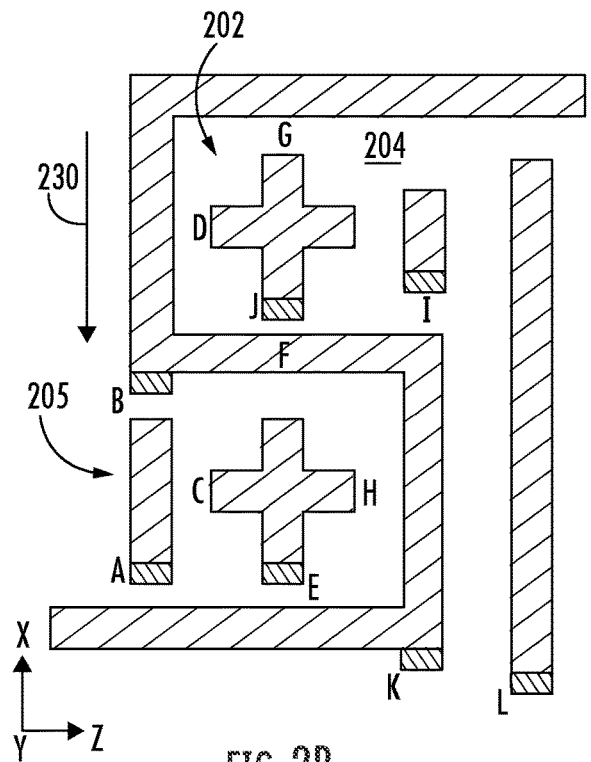
Figure 2C:
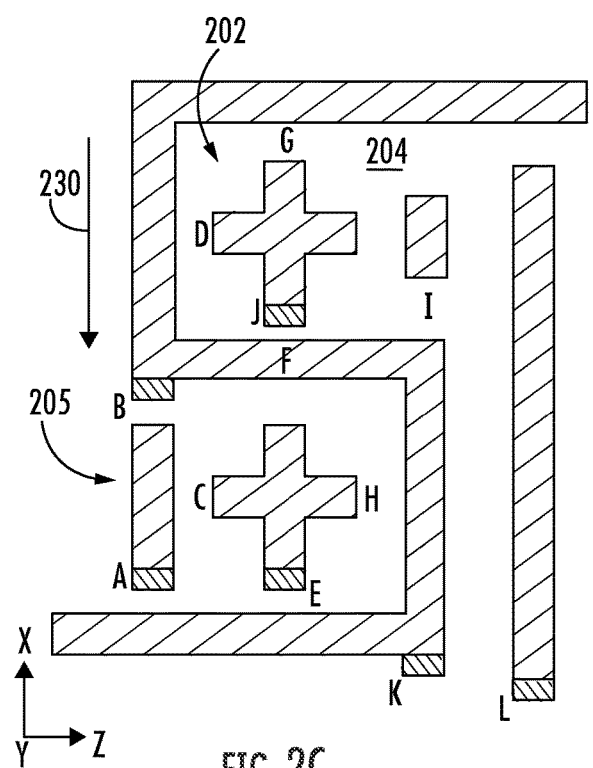

In FIG. 2B, the ions 230 may be delivered to the substrate 202 at approximately 25° relative to a perpendicular extending in the y-direction from an upper surface 204 of the substrate 202. Similar to FIG. 2A, regions A, B, E, I, J, K, and L of the trenches 205 become elongated (e.g., along the x-direction) as a result of the ion beam etch, while regions C, D, F, G, and H are generally unaffected by the ions 230. However, as shown in FIG. 2C, region I is prevented from receiving the ions 230 when the ions 230 are delivered to the substrate 202 at an angle of approximately 35° due to the beam angle and the relatively shorter trench length (i.e., along the x-direction). Again, regions C, D, F, G, and H remain shadowed due to the aspect ratio of the associated trenches.

Figure 2D:
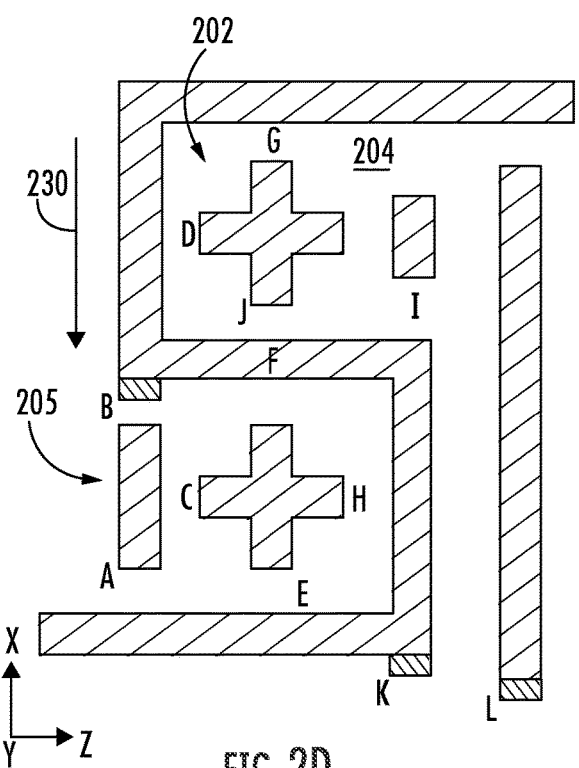
Figure 2E:
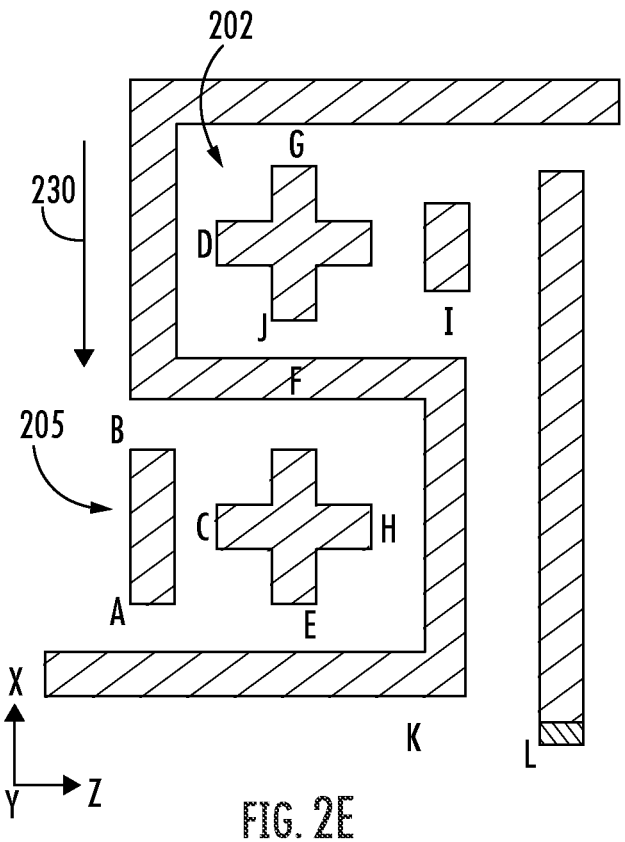

As the angle of the ions 230 increase to between 45-55°, trench elongation is now also prevented from occurring in regions A, E, and J, as shown in FIG. 2D. In this example, elongation is present only in regions B, K, and L due to the length of the associated trenches 205 in the x-direction. As shown in FIG. 2E, when the angle of the ions 230 is further increased to 65°, trench elongation occurs only in region L.

Figure 3:
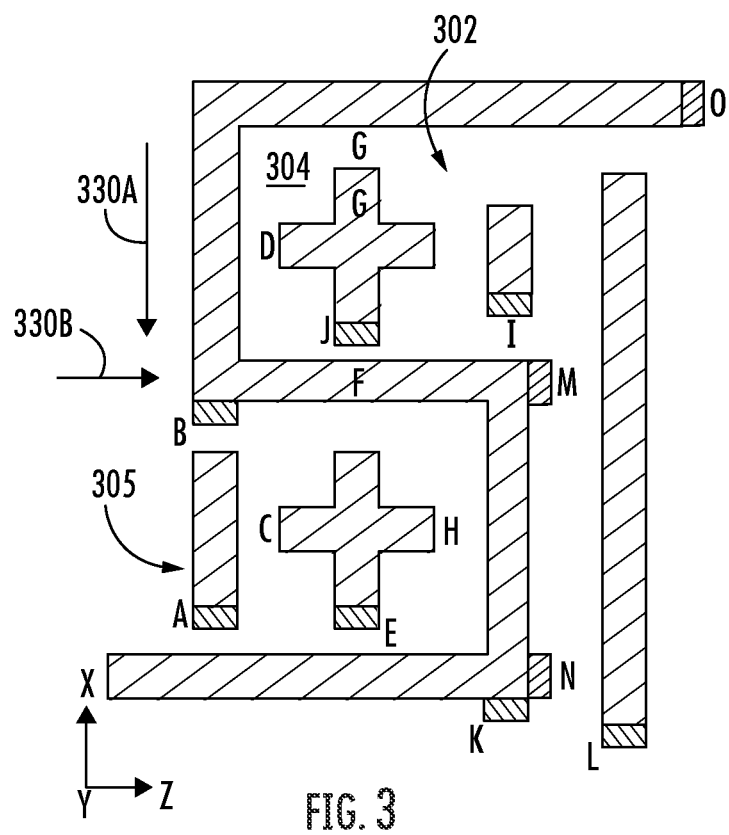
FIG. 3 is a top view demonstrating processing of a substrate including trenches, according to embodiments of the present disclosure.

As shown in FIG. 3, in some embodiments, a first ion beam etch 330A may be performed in a first direction (e.g., x-direction), and a second ion beam etch 330B may be performed in a second direction (e.g., z-direction). The first and second ion beam etches 330A, 330B may include delivering ions into a substrate 302 at a non-zero angle relative to a perpendicular extending in the y-direction from an upper surface 304 of the substrate 302. To accomplish this, an ion beam tool (not shown) and the substrate 302 may be rotated relative to one another (e.g., by 90°) between etch processes. As a result, regions A, B, E, I, J, K, and L of the trenches 305 become elongated in the x-direction from the first ion beam etch 330A, while regions M, N, and O of the trenches 305 become elongated in the z-direction from the second ion beam etch 330B. As shown, not all trenches 305 with a primary axis extending along the z-direction are etched in this example, however. For example, region H is not etched due to the angle of the ion beam and the aspect ratio of the associated trench. Regions C, D, F, and G are also generally unaffected by the first and second ion beam etches 330A, 330B. It will be appreciated that the first and second ion beam etches 330A, 330B may be performed at a variety of different angles, e.g., as described above with reference to FIGS. 2A-2E.

Figure 4A:
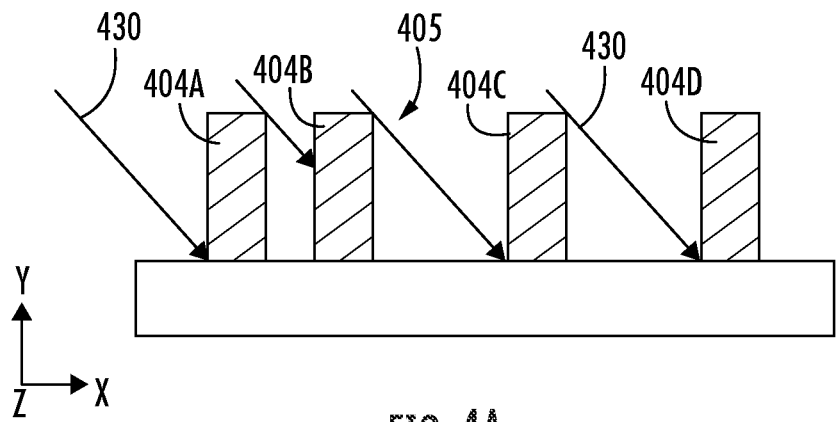
FIGS. 4A-4C are side views demonstrating processing of a substrate including a plurality of substrate features, according to embodiments of the present disclosure.
Figure 4B:
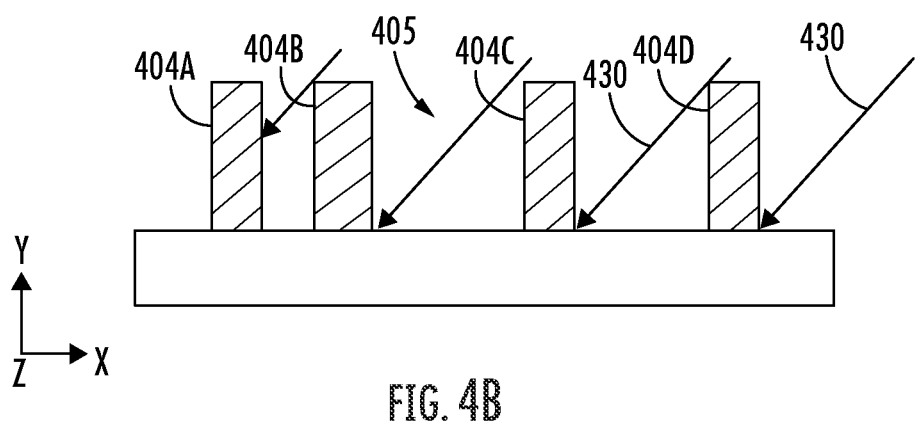
Figure 4C:
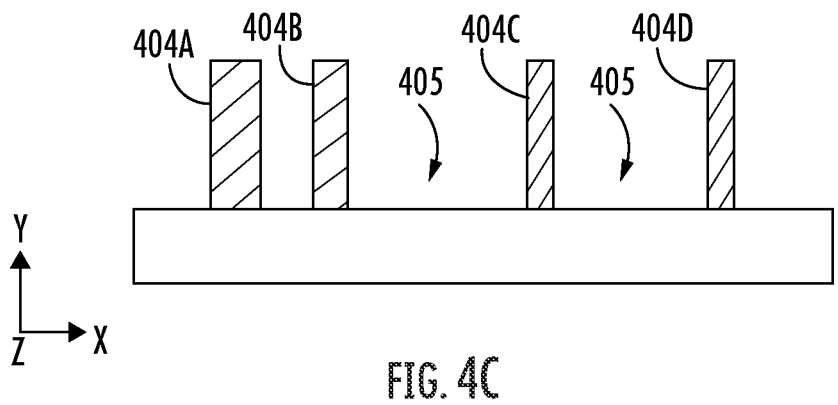

FIGS. 4A-4C demonstrate a plurality of substrate features 404A-404D defined by a plurality of trenches 405, wherein the substrate features 404A-404D may be pillar or line structures. Beam angle of an ion trajectory etch 430 can be used to prevent etching of pillar/line structure arrays depending on the aspect ratio, controlling which of the pillar/line structures are impacted and thus thinned. In this example, different trenches 405 have different lengths between opposite sidewalls, e.g., along the x-direction. That is, a length of the trench 405 between substrate feature 404A and 404B is less than a length of the trench 405 between substrate features 404B and 404C. As a result, the ion trajectory etch 430 may not impact an entire height of substrate feature 404A due to the shadowing from substrate feature 404B, as demonstrated in FIG. 4B. More material is therefore removed from substrate features 404B, 404C, 404D than from substrate feature 404A during the ion trajectory etch 430, as demonstrated in FIG. 4C.

Figure 5A:
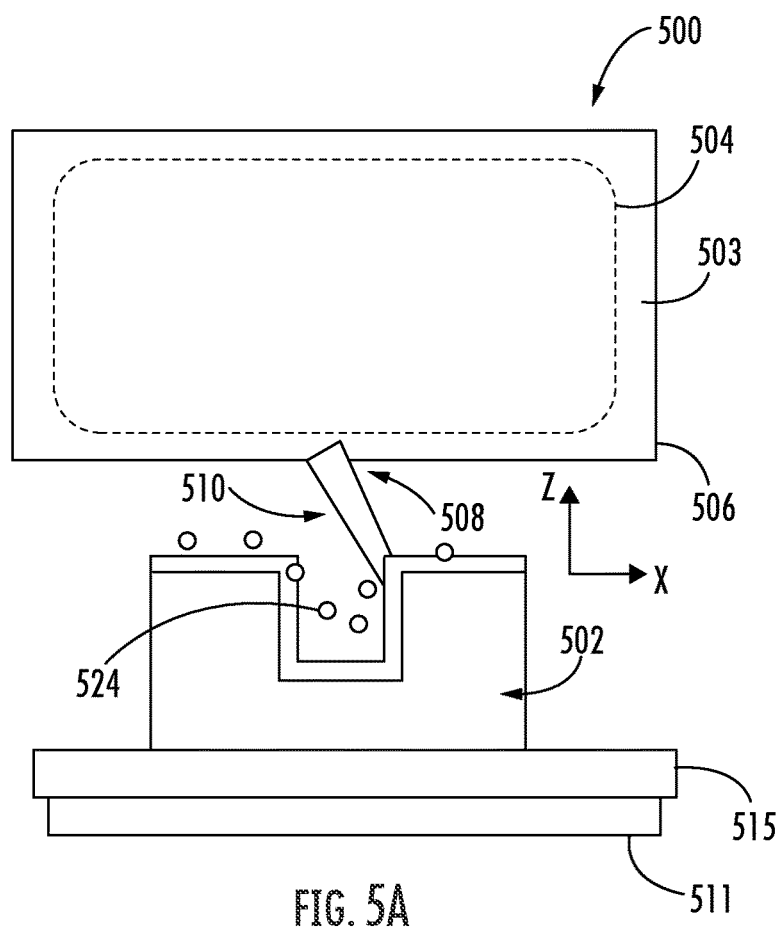
FIG. 5A illustrates an exemplary processing apparatus according to embodiments of the disclosure.

Turning now to FIG. 5A, an exemplary processing apparatus 500 for providing an ion exposure is illustrated. The processing apparatus 500 may be a compact plasma processing system operable to generate an ion beam shown as ions 510. Ions 510 may be the same or similar to ions 130, 230, 330, and/or 430 described herein. More specifically, a substrate 502 may be exposed to reactive neutral species 524, where the reactive neutral species 524 are derived from precursor gas composition used to generate the RIE plasma. The reactive neutral species 124 may arrive isotropically to the substrate 502, where every portion of the different exposed surfaces of the substrate 502 are impacted by the reactive neutral species 524. Notably, the present embodiments harness the principles of RIE processing where etching of a given surface is enhanced in the presence of ions. Notably, in accordance with the present embodiments, etching may take place just in regions of the substrate 502 impacted by the directional ions, i.e., in regions impacted by the ions 510, while leaving other surfaces unetched.

Figure 5B:
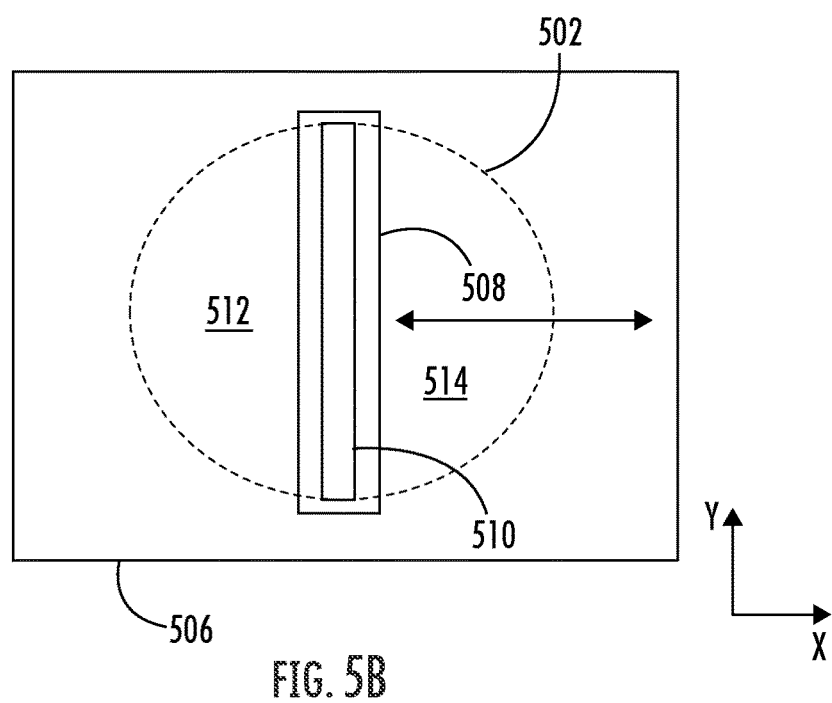
FIG. 5B depicts details of an exemplary extraction plate according to embodiments of the disclosure.

The ion beam may be extracted from a plasma 504 generated in a plasma chamber 503 by any known technique. The processing apparatus 500 may include an extraction plate 506 having an extraction aperture 508, where the ions are extracted as an ion beam from the plasma 504 and directed to the substrate 502. The substrate 502 may be the same as substrates 102, 202, 302, and/or 402. As shown in FIG. 5B, the extraction aperture 508 may be elongated along the Y-axis, providing a ribbon ion beam extending, for example, over an entire substrate along the direction parallel to the Y-axis. In various embodiments, the substrate 502 may be disposed on a substrate holder 515 and scanned along the X-axis to provide coverage at different regions of the substrate 502 or over the entirety of the substrate. In other embodiments, the extraction aperture 508 may have a different shape such as a square or circular shape.

In some embodiments, the plasma chamber 503 may also serve as a deposition process chamber to provide material for depositing on the substrate 502 in the deposition operation preceding etching. The substrate holder 515 may further include a heater assembly 511 for selectively heating the substrate 502 to different temperatures in different regions within the X-Y plane for selectively changing the amount of depositing material as discussed above.

During an ion exposure, reactive species may be provided or created in the plasma chamber 503 and may also impinge upon the substrate 502. While various non-ionized reactive species may impinge upon all surfaces of substrate 502, including different surfaces in one or more cavities, etching may take place in areas impacted by the ions 510, as in known RIE processes, while little or no etching takes place in regions not impacted by ions 510. Thus, referring to FIGS. 1A-1C discussed above, the ions 130 etch the second end wall 124 of the first trench 111 to increase the first length L1 of the first trench 111 by removing a portion 128 of the second end wall 124. However, the ions 130 of the angled RIE do not impact the second trench bottom surface 135 and do not impact an entire height of the second sidewall 132. Instead, the ions 130 are shadowed by the first sidewall 131 of the second trench 112, and may impact just an upper portion of the second sidewall 132.

In further embodiments, directional etching of ions may be performed by rotating a substrate within the X-Y plane to any desired angle. Thus, a trench feature may be oriented with its long axis at a 45-degree angle with respect to the Y-axis while a ribbon beam directed to the trench feature has its axis oriented along the Y-axis as in FIG. 5B.

In additional embodiments, by scanning the substrate 502 with respect to the ion beam 510, such as along the X-axis as generally shown in FIG. 5B, the possibility is afforded to vary a directed etch across the substrate 502 to achieve location-specific directional selectivity of etching, so features within a certain region, such as region 512 of the substrate may be altered to one extent while features in another region, such as region 514, are not altered or are altered to a different extent or in a different fashion. For example, the ion beam 510 may be present when region 512 is under extraction aperture 508, while the ion beam is extinguished when the region 514 is under extraction aperture 508.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
providing a substrate including a plurality of trenches, wherein a first trench of the plurality of trenches has a first trench length extending in a first direction, wherein a second trench of the plurality of trenches has a second trench length extending in a second direction, wherein the first direction and the second direction are non-parallel, and wherein the first and second trenches are connected; and
delivering ions into the substrate in a reactive ion etching process, wherein the ions are delivered at a non-zero angle relative to a perpendicular extending from the substrate, and wherein the reactive ion etching process increases the first trench length of the first trench without increasing the second trench length of the second trench.

2. The method of claim 1, wherein delivering ions into the substrate in the reactive ion etching process comprises delivering ions into a first trench bottom surface of the first trench, and wherein the ions are prevented from being delivered into a second trench bottom surface of the second trench.

3. The method of claim 2, further comprising delivering the ions into a sidewall of the second trench without delivering the ions into the second trench bottom surface of the second trench.

4. The method of claim 1, wherein a first aspect ratio of the first trench is different than a second aspect ratio of the second trench.

5. The method of claim 1, further comprising:
rotating, after the ions etch the end wall of the first trench, the ions and the substrate relative to one another; and
etching an end wall of the second trench to increase the second trench length of the second trench.

6. The method of claim 5, wherein delivering ions into the substrate in the reactive ion etching process further comprises delivering the ions into a second trench bottom surface of the second trench, and wherein the ions are prevented from being delivered into a first trench bottom surface of the first trench.

7. The method of claim 6, further comprising delivering the ions into a sidewall of the first trench without delivering the ions into the first trench bottom surface of the first trench.

8. The method of claim 1, further comprising orienting the first trench and the second trench perpendicular to one another.

9. A method, comprising:
providing a substrate including a plurality of trenches, wherein a first trench of the plurality of trenches has a first trench length extending in a first direction, wherein a second trench of the plurality of trenches, connected to the first trench, has a second trench length extending in a second direction, and wherein the first direction and the second direction are non-parallel; and
etching an end wall of the first trench to increase the first trench length of the first trench by delivering reactive ions into the substrate at a non-zero angle relative to a perpendicular extending from the substrate, wherein the length of the first trench is increased without increasing the second trench length of the second trench.

10. The method of claim 9, wherein the etching further comprises delivering the reactive ions into a first trench bottom surface of the first trench, and wherein the reactive ions are prevented from being delivered into a second trench bottom surface of the second trench.

11. The method of claim 10, wherein the etching further comprises delivering the reactive ions into a sidewall of the second trench without delivering the reactive ions into the second trench bottom surface of the second trench.

12. The method of claim 10, further comprising:
rotating, after reactive ions etch the end wall of the first trench, the reactive ions and the substrate relative to one another; and
etching an end wall of the second trench to increase the second trench length of the second trench.

13. The method of claim 12, wherein etching the end wall of the second trench further comprises delivering reactive ions into a second trench bottom surface of the second trench, wherein the reactive ions are prevented from being delivered into a first trench bottom surface of the first trench.

14. The method of claim 12, further comprising delivering the reactive ions into a sidewall of the first trench without delivering the reactive ions into the first trench bottom surface of the first trench.

15. A trench elongation method, comprising:
providing a substrate including a plurality of surface features defining a plurality of trenches, wherein a first trench has a first trench length extending in a first direction, wherein a second trench connected to the first trench has a second trench length extending in a second direction, and wherein the first direction and the second direction are perpendicular to one another; and
etching an end wall of the first trench to increase the first trench length of the first trench by delivering ions into the substrate at a non-zero angle relative to a perpendicular extending from the substrate, wherein the first trench length of the first trench is increased without increasing the second trench length of the second trench.

16. The trench elongation method of claim 15, wherein delivering the ions comprises delivering the ions into a first trench bottom surface of the first trench, and wherein the ions are prevented from being delivered into a second trench bottom surface of the second trench.

17. The trench elongation method of claim 16, further comprising delivering the ions into a sidewall of the second trench without delivering the ions into the second trench bottom surface of the second trench.

18. The trench elongation method of claim 15, wherein a first aspect ratio of the first trench is different than a second aspect ratio of the second trench.

19. The trench elongation method of claim 15, further comprising:
rotating, after the ions etch the end wall of the first trench, the ions and the substrate relative to one another; and
etching an end wall of the second trench to increase the second trench length of the second trench.

* * * * *